United States Patent
Wang et al.

(10) Patent No.: US 8,698,247 B2
(45) Date of Patent: Apr. 15, 2014

(54) SEMICONDUCTOR DEVICE

(75) Inventors: Chih-Chung Wang, Hsinchu (TW);
Wei-Lun Hsu, Hsin-Chu Hsien (TW);
Te-Yuan Wu, Hsinchu (TW); Wen-Fang Lee, Hsin-Chu (TW); Ke-Feng Lin, Taipei (TW); Shan-Shi Huang, Hsinchu (TW); Ming-Tsung Lee, Yilan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 224 days.

(21) Appl. No.: 13/156,352

(22) Filed: Jun. 9, 2011

(65) Prior Publication Data

US 2012/0313175 A1 Dec. 13, 2012

(51) Int. Cl.
*H01L 23/62* (2006.01)

(52) U.S. Cl.
USPC .... 257/362; 257/339; 257/487; 257/E27.016; 257/E29.014

(58) Field of Classification Search
USPC ......... 257/288, 339, 355, 362, 376, 392, 399, 257/400, 409, 476, 481, 483, 484, 487, 488, 257/490, 494, 495, 544, 546, 548, 550, 551, 257/E27.016, E29.007, E29.088, E29.009, 257/E29.012, E29.013, E29.014, E29.015
See application file for complete search history.

(56) References Cited

U.S. PATENT DOCUMENTS

| 5,637,900 | A | 6/1997 | Ker | |
|---|---|---|---|---|
| 5,959,820 | A | 9/1999 | Ker | |
| 6,724,677 | B1 | 4/2004 | Su | |
| 6,909,149 | B2 | 6/2005 | Russ | |
| 6,917,095 | B1 * | 7/2005 | Wong et al. | 257/548 |
| 7,009,252 | B2 | 3/2006 | Lin | |
| 7,027,276 | B2 | 4/2006 | Chen | |
| 7,166,876 | B2 * | 1/2007 | Huang | 257/213 |
| 7,205,612 | B2 | 4/2007 | Cai | |
| 7,368,761 | B1 | 5/2008 | Lai | |
| 7,672,100 | B2 | 3/2010 | Van Camp | |
| 7,972,917 | B2 * | 7/2011 | Furuhata et al. | 438/199 |
| 8,143,690 | B2 * | 3/2012 | Park et al. | 257/476 |
| 2003/0076636 | A1 | 4/2003 | Ker | |
| 2006/0267102 | A1 | 11/2006 | Cheng | |
| 2009/0140370 | A1 * | 6/2009 | Jou et al. | 257/487 |
| 2011/0042730 | A1 * | 2/2011 | Tajiri et al. | 257/288 |

* cited by examiner

*Primary Examiner* — Eduardo A Rodela
(74) *Attorney, Agent, or Firm* — Winston Hsu; Scott Margo

(57) ABSTRACT

The present invention provides a semiconductor device including a substrate, a deep well, a high-voltage well, and a doped region. The substrate and the high-voltage well have a first conductive type, and the deep well and the doped region have a second conductive type different from the first conductive type. The substrate has a high-voltage region and a low-voltage region, and the deep well is disposed in the substrate in the high-voltage region. The high-voltage well is disposed in the substrate between the high-voltage region and the low-voltage region, and the doped region is disposed in the high-voltage well. The doped region and the high-voltage well are electrically connected to a ground.

11 Claims, 2 Drawing Sheets

US 8,698,247 B2

SEMICONDUCTOR DEVICE

BACKGROUND OF THE INVENTION

1. Field of the Invention

The present invention relates to a semiconductor device, and more particularly, to a semiconductor device having electrostatic discharge protection.

2. Description of the Prior Art

Electrical apparatuses usually include different devices that require different operating voltages, so a power conversion device is required to adjust (boost or buck) a voltage level to be stable at a preset voltage. In the prior art, the power conversion device utilizes a driving device to control a high-voltage switching device and a low-voltage switching device, and provides a required high voltage or low voltage by respectively turning on the high-voltage switching device or low-voltage switching device.

Since the high-voltage switching device and the low-voltage switching device operate in different voltage ranges, the driving device should be divided into a high-voltage region and a low-voltage region, and a high-voltage driving device disposed in the high-voltage region and a low-voltage driving device disposed in the low-voltage region also operate different voltages so as to have abilities to control the high-voltage switching device and the low-voltage switching device together. The high-voltage driving device is electrically connected to a high-voltage power and is driven by the high voltage generated from the high-voltage power. The driving device further includes a level shift device electrically connected between the high-voltage driving device and the low-voltage driving device, so that the high voltage can be reduced to the low voltage corresponding to the operating voltage range of the low-voltage driving device.

In the prior art, the high-voltage driving device and the low driving device are fabricated on a same substrate, and respectively disposed on different deep wells. The voltage range of the high-voltage driving device is designed to operate between 700 volts and 730 volts. However, when an ESD event occurs in the high-voltage driving device, static charges would be accumulated in the deep well of the high-voltage region, and the ESD voltage is easily larger than 1300 volts, so that a junction between the deep well of the high-voltage region and the substrate is easily broken down and damaged. Even the level shift device is also damaged.

As a result, to prevent the junction between the deep well of the high-voltage region and the substrate and the level shift device from being damaged by the ESD event is an important objective in this field.

SUMMARY OF THE INVENTION

It is therefore a primary objective of the present invention to provide a semiconductor device to prevent the junction between the deep well of the high-voltage region and the substrate and the level shift device from being damaged by the ESD event.

According to an embodiment of the present invention, a semiconductor device is disclosed. The semiconductor device includes a substrate, a first deep well, a first high-voltage well, and a first doped region. The substrate has a first conductive type, and the substrate has a high-voltage region and a low-voltage region. The first deep well is disposed in the substrate in the high-voltage region, and the first deep well has a second conductive type different from the first conductive type. The first high-voltage well is disposed in the substrate between the high-voltage region and the low-voltage region, and the first high-voltage well has the first conductive type. The first doped region is disposed in the first high-voltage well, and has the second conductive type, wherein the first doped region and the first high-voltage well are electrically connected to a ground.

According to another embodiment of the present invention, a semiconductor device is disclosed. The semiconductor device includes a high-voltage metal-oxide-semiconductor (HV MOS) transistor, a diode, and a bipolar junction transistor (BJT). The HV MOS transistor has a gate, a source, a drain, and a first base, wherein the gate is electrically connected to the source, and the drain is electrically connected to a high-voltage input pad. The diode has an anode and a cathode, and the anode is electrically connected to the first base. The BJT has an emitter, a second base and a collector, wherein the collector is electrically connected to the cathode, and the emitter and the second base are electrically connected to a ground.

The semiconductor device of the present invention has the N-type first doped region disposed in the P-type first high-voltage well, so the N-type first doped region, the N-type first deep well and the P-type substrate constitute a BJT. Also, the P-type first high-voltage well and the N-type first doped region are electrically connected to the ground. Accordingly, the BJT can be used to discharge the static charges, and the junction between the N-type first deep well and the P-type substrate and the level-shift device electrically connected to the HV MOS transistor can be avoided from being damaged by the static charges.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
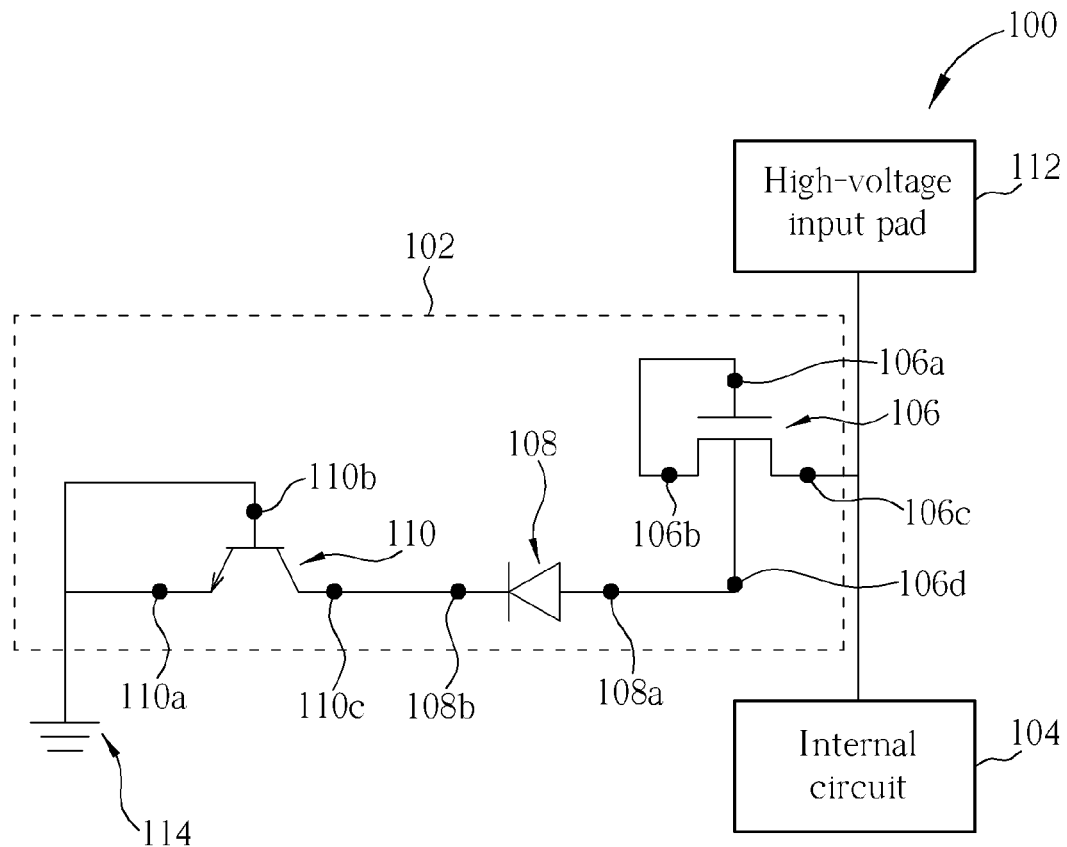
FIG. 1 is a circuit diagram illustrating a semiconductor device according to a preferred embodiment of the present invention.

Refer to FIG. 1, and FIG. 1 is a circuit diagram illustrating a semiconductor device according to a preferred embodiment of the present invention. As shown in FIG. 1, the semiconductor device 100 includes an electrostatic discharge (ESD) protection circuit 102, and an internal circuit 104, and the ESD protection circuit 102 includes a high-voltage metal-oxide-semiconductor (HV MOS) transistor 106, a diode 108, and a bipolar junction transistor (BJT) 110. The HV MOS transistor 106 has a gate 106a, a first source 106b, a first drain 106c, and a first base 106d. The gate 106a is electrically connected to the first source 106b, and the first drain 106c is electrically connected to a high-voltage input pad 112 and the internal circuit 104. The high-voltage input pad 112 is used to electrically connect a high-voltage power for providing a high voltage, such as a super high-voltage power providing 700 volts to 730 volts. The diode 108 has an anode 108a and a cathode 108b, and the anode 108a is electrically connected to the first base 106d of the HV MOS transistor 106. The BJT 110 has an emitter 110a, a second base 110b, and a collector 110c. The collector 110c is electrically connected to the cathode 108b, and the emitter 110a and the second base 110b are electrically connected to a ground 114. In this embodiment, the HV MOS transistor 106 is an N-type HV MOS (HV NMOS) transistor, and the BJT 110 is an NPN-type BJT, but the present invention is not limited to this. The HV MOS transistor 106 and the BJT 110 of the present invention also can be a P-type HV MOS transistor and a PNP-type BJT respectively. In addition, the HV NMOS transistor 106 and the diode 108 in combination with the internal circuit constitute a high-side driving circuit used to driving a high-side power device, but are not limited to this. The internal circuit 104 of the present invention also can include low-voltage MOS transistors and level shift devices that constitute a low-side driving circuit.

It should be noted that when an ESD event occurs in the high-voltage input pad 112 or the high-voltage power, static charges flow into the HV MOS transistor 106, and pass through the first base 106d of the HV MOS transistor 106 and the diode 108 sequentially. Then, the static charges are introduced to the collector 110c, and the BJT 110 is thus triggered to turn on. Accordingly, the static charges can be discharged to the ground 114. Furthermore, the BJT 110 is in an OFF state when the high-side driving circuit operates.

Figure 2:
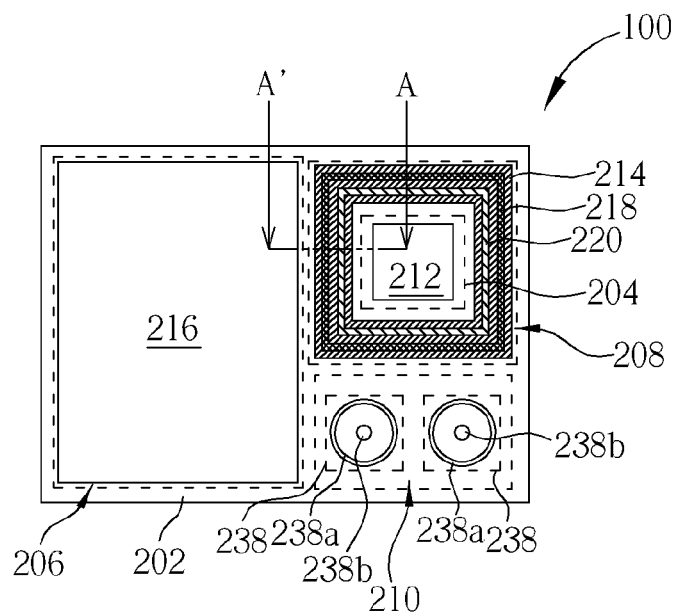
FIG. 2 is a schematic diagram illustrating a top view of the semiconductor device according to the preferred embodiment of the present invention.

The following description further details the structure of the semiconductor device according to this embodiment. Refer to FIG. 2 together with FIG. 1. FIG. 2 is a schematic diagram illustrating a top view of the semiconductor device according to the preferred embodiment of the present invention. As shown in FIG. 2, the semiconductor device 100 is fabricated on a substrate 202, such as silicon substrate, and the substrate 202 has a first conductive type, such as P type. The substrate 202 has a high-voltage region 204, a low-voltage region 206, a pick-up region 208, and a level-shift region 210. The high-voltage region 204 is used to fabricate the HV MOS transistor 106 that is electrically connected to the high-voltage input pad 112, and the low-voltage region 206 is used to fabricate the low-voltage MOS transistors. The pick-up region 208 is used to fabricate devices electrically connecting the substrate 202 to the outside, and the pick-up region 208 is disposed between the high-voltage region 204 and the low-voltage region 206 and surrounds the high-voltage region 204. The level-shift region 210 is used to fabricate the level-shift devices, and is disposed adjacent to the high-voltage region 204 and the low-voltage region 206. In this embodiment, the high-voltage region 204 is a high-side region that is used to dispose the high-side driving circuit for driving the high-side power device. The low-voltage region 206 is a low-side region that is used to dispose the low-side driving circuit for driving a low-side power device.

Figure 3:
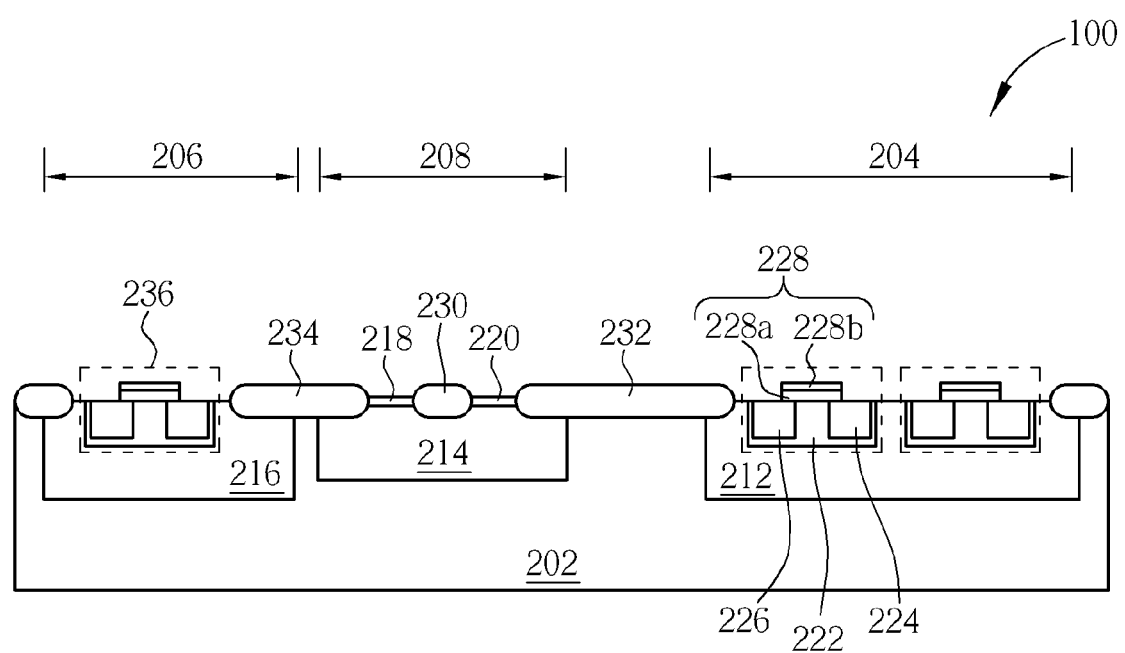
FIG. 3 is a schematic diagram illustrating a cross-sectional view of FIG. 2 along a cross-sectional line AA'.

Refer to FIG. 3 together with FIG. 1 and FIG. 2. FIG. 3 is a schematic diagram illustrating a cross-sectional view of FIG. 2 along a cross-sectional line AA'. As shown in FIG. 1 to FIG. 3, the semiconductor device 100 includes a first deep well 212, a first high-voltage well 214, a second deep well 216, a first doped region 218, and a second doped region 220. The first high-voltage well 214 and the second doped region have the first conductive type, and the first deep well 212, the second deep well 216 and the first doped region 218 have a second conductive type different from the first conductive type, such as N type, but the present invention is not limited to this. The first conductive type and the second conductive type of the present invention also can be exchanged.

In this embodiment, the N-type first deep well 212 is disposed in the P-type substrate in the high-voltage region 204, and the N-type second deep well 216 is disposed in the P-type substrate 202 in the low-voltage region 206. The P-type first high-voltage well 214 is disposed in the P-type substrate 202 of the pick-up region 208 and surrounds the high-voltage region 204, and the P-type first high-voltage well 214 is not in contact with the N-type first deep well 212 and the N-type second deep well 216. The N-type first doped of this embodiment surrounds the P-type second doped region 220, but is not limited to this. The position of the N-type first doped region 218 and the position of the P-type second doped region 220 in the present invention also can be exchanged, and the P-type second doped region 220 surrounds the N-type first doped region 218. It is worthy of note that P-type second doped region 220 can be used to electrically connect the P-type substrate 202 to the ground 114, so that the voltage potential of the P-type substrate 202 can be substantially the same as the voltage potential of the ground 114. Furthermore, the N-type first deep well 212, the P-type substrate 202, the P-type first high-voltage well 214 and the N-type first doped region 218 can constitute the NPN-type BJT 110. The N-type first deep well 212 serves as the collector 110c of the NPN-type BJT 110. The P-type first high-voltage well 214 and the P-type substrate 202 serve as the second base 110b of the NPN-type BJT 110. The N-type first doped region 218 serves as the emitter 110a of the NPN-type BJT 110. In addition, the semiconductor device 100 can further include a first isolation structure 230, a second isolation structure 232, and a third isolation structure 234. The first isolation structure 230 is disposed on the P-type first high-voltage well 214 between the N-type first doped region 218 and the P-type second doped region 220, and is used to isolate the N-type first doped region 218 from the P-type second doped region 220. The second isolation structure 232 is disposed on the P-type substrate 202 between the P-type high-voltage well 214 and the N-type first deep well 212, and the third isolation structure 234 is disposed on the P-type substrate 202 between the P-type high-voltage well 214 and the N-type second deep well 216.

Besides, the semiconductor device 100 further includes a P-type second high-voltage well 222, an N-type third doped region, an N-type fourth doped region 226, and a gate structure 228, and the P-type second high-voltage well 222, the N-type third doped region 224, the N-type fourth doped region 226 and the gate structure 228 constitute the HV NMOS transistor 106. The P-type second high-voltage well 222 is disposed in the N-type first deep well 212, and serves as the first base 106d of the HV NMOS transistor 106. The N-type third doped region 224 is disposed in the P-type second high-voltage well 222, and serves as the first drain 106c of the HV NMOS transistor 106. The N-type fourth doped region 226 is disposed in the P-type second high-voltage well 222, and serves as the first source 106b. The gate structure 228 includes a gate dielectric layer 228a and a gate electrode 228b, which are disposed on the P-type second high-voltage well 222 between the N-type third doped region 224 and the N-type fourth doped region 226, and the gate electrode 228b serves as the gate 106a of the HV NMOS transistor 106. Furthermore, the P-type second high-voltage well 222 and the N-type first deep well 212 constitute the diode. The P-type second high-voltage well 222 serves as the anode, and the N-type first deep well 212 serves as the cathode.

It is worthy of note that the HV NMOS transistor 106 is electrically connected to the high-voltage power through the high-voltage input pad 112, and when the ESD event occur in the high-voltage input pad 112 or high-voltage power, the static charges are introduced to the N-type first deep well 212. Accordingly, the NPN-type BJT 110 using the N-type first deep well 212 as the collector 110c can introduce the static charges to the ground 114, and the junction between the N-type first deep well 212 and the P-type substrate and the internal circuit electrically connected to the high-voltage input pad 112 can be therefore protected. Furthermore, the HV NMOS transistor 106 operates at the high voltage, and the high electric field generated from the high voltage extends to the N-type first deep well 212. Thus, the N-type first deep well 212 and the P-type substrate 202 require having an enough ability to endure voltage in order to avoid breaking down. The break down voltage of the junction between the N-type first deep well 212 and the P-type substrate 202, such as 800 volts, is larger than the high voltage provided by the high-voltage power so as to avoid breaking down when the high-side driving circuit operates. Furthermore, the operating voltage range of the NPN-type BJT 110 in this embodiment is preferably between the operating voltage of the HV NMOS transistor 106 and the break down voltage of the junction between the N-type first deep well 212 and the P-type substrate 202, so the NPN-type BJT 110 is in the OFF state when the high-side driving circuit operates, and the NPN-type BJT 110 is in an ON state when the ESD event occurs. Thus, the junction between the N-type first deep well 212 and the P-type substrate 202 can be avoided from breaking down.

In this embodiment, the semiconductor device further includes at least one low-voltage MOS (LV MOS) transistor 236 (as shown in FIG. 3), and at least one level-shift device 238 (as shown in FIG. 2). The LV MOS transistor 236 is disposed on the N-type second deep well 216 in the low-voltage region 206, and the level-shift device 238 is disposed on the P-type substrate 202 in the level-shift region 210. The level-shift device 238 is a HV MOS transistor, and has a second source 238a and a second drain 238b. The second source 238a is electrically connected to the LV MOS transistor 236 in the low-voltage region 206, and the second drain 238b is electrically connected to the HV NMOS transistor 106 in the high-voltage region 204. Accordingly, the level-shift device 238 is electrically connected between the HV NMOS transistor 106 and the LV MOS transistor 236, and the level-shift device 238 reduces the high voltage provided from the high-voltage power to the voltage corresponding to the operating voltage range of the LV MOS transistor 236, such as 0 to 30 volts and provides the voltage to the LV MOS transistor 236. When the ESD event occurs in the high-voltage input pad 112 or high-voltage power, the NPN-type BJT 110 introducing the static charges to the ground 114 can further protect the level-shift device 238 electrically connected to the HV NMOS transistor 106 from being damaged by the static charges.

In summary, the semiconductor device of the present invention has the N-type first doped region disposed in the P-type first high-voltage well, so the N-type first doped region, the N-type first deep well and the P-type substrate constitute a BJT. Also, the P-type first high-voltage well and the N-type first doped region are electrically connected to the ground. Accordingly, the BJT can be used to discharge the static charges, and the junction between the N-type first deep well and the P-type substrate and the level-shift device electrically connected to the HV MOS transistor can be avoided from being damaged by the static charges.

Those skilled in the art will readily observe that numerous modifications and alterations of the device and method may be made while retaining the teachings of the invention.

What is claimed is:

1. A semiconductor device, comprising:
   a substrate, having a first conductive type, and the substrate having a high-voltage region and a low-voltage region;
   a first deep well, disposed in the substrate in the high-voltage region, and the first deep well having a second conductive type different from the first conductive type;
   a first high-voltage well, disposed in the substrate between the high-voltage region and the low-voltage region, and the first high-voltage well having the first conductive type;
   a first doped region, disposed in the first high-voltage well, and having the second conductive type, wherein the first doped region and the first high-voltage well are electrically connected to a ground, and the first deep well, the substrate, the first high-voltage well and the first doped region constitute a bipolar junction transistor (BJT);
   at least one high-voltage metal-oxide-semiconductor (HV MOS) transistor, disposed in the high-voltage region, and the HV MOS transistor having a drain electrically connected to a high-voltage input pad provided with a voltage; and
   a low voltage MOS transistor, disposed in the low voltage region and operated in a voltage range smaller than the voltage.

2. The semiconductor device according to claim 1, further comprising a second doped region, disposed in the first high-voltage well, and having the first conductive type, wherein the second doped region electrically connects the first high-voltage well and the ground.

3. The semiconductor device according to claim 2, further comprising a first isolation structure, disposed on the first high-voltage well between the first doped region and the second doped region.

4. The semiconductor device according to claim 2, wherein the first high-voltage well, the first doped region and the second doped region surround the high-voltage region.

5. The semiconductor device according to claim 1, further comprising a second isolation structure, disposed on the substrate between the first high-voltage well and the first deep well.

6. The semiconductor device according to claim 1, further comprising a second deep well, disposed in the substrate in the low-voltage region, and having the second conductive type.

7. The semiconductor device according to claim 6, further comprising a third isolation structure, disposed on the substrate between the first high-voltage well and the second deep well.

8. The semiconductor device according to claim 6, wherein the first deep well, the first high-voltage well and the second deep well are not in contact with one another.

9. The semiconductor device according to claim 1, wherein the HV MOS transistor comprises:
   a second high-voltage well, disposed in the first deep well, and having the first conductive type;
   a third doped region, disposed in the second high-voltage well and having the second conductive type, and the third doped region serving as the drain of the HV MOS;
   a fourth doped region, disposed in the second high-voltage well and having the second conductive type, and the fourth doped region serving as a source of the HV MOS; and
   a gate structure, disposed on the second high-voltage well between the third doped region and the fourth doped region, and the gate structure serving as a gate of the HV MOS.

10. The semiconductor device according to claim 1, wherein the high-voltage region is a high side region, and the low-voltage region is a low side region.

11. The semiconductor device according to claim 1, wherein the high-voltage input pad is electrically connected to a high-voltage power.

* * * * *